US010985098B2

(12) United States Patent
Imayoshi

(10) Patent No.: US 10,985,098 B2
(45) Date of Patent: Apr. 20, 2021

(54) ELECTRONIC COMPONENT MOUNTING SUBSTRATE, ELECTRONIC DEVICE, AND ELECTRONIC MODULE

(71) Applicant: KYOCERA Corporation, Kyoto (JP)

(72) Inventor: Michio Imayoshi, Kyoto (JP)

(73) Assignee: KYOCERA CORPORATION, Kyoto (JP)

(*) Notice: Subject to any disclaimer, the term of this patent is extended or adjusted under 35 U.S.C. 154(b) by 0 days.

(21) Appl. No.: 16/094,976

(22) PCT Filed: Apr. 25, 2017

(86) PCT No.: PCT/JP2017/016386
§ 371 (c)(1),
(2) Date: Oct. 19, 2018

(87) PCT Pub. No.: WO2017/188253
PCT Pub. Date: Nov. 2, 2017

(65) Prior Publication Data
US 2019/0148278 A1    May 16, 2019

(30) Foreign Application Priority Data

Apr. 25, 2016  (JP) .............................. JP2016-087154

(51) Int. Cl.
*H01L 23/498* (2006.01)
*H01L 23/13* (2006.01)
(Continued)

(52) U.S. Cl.
CPC ........ *H01L 23/49827* (2013.01); *H01L 23/12* (2013.01); *H01L 23/13* (2013.01);
(Continued)

(58) Field of Classification Search
CPC ........... H01L 23/49827; H01L 23/3121; H01L 23/49822; H01L 23/49838; H01L 24/16;
(Continued)

(56) References Cited

U.S. PATENT DOCUMENTS 6,351,031 B1 * 2/2002 Iijima ................... H01L 21/563
257/635
8,421,213 B2 * 4/2013 Hsu ......................... H01L 24/19
257/698
(Continued)

FOREIGN PATENT DOCUMENTS

JP        2015-043374 A    3/2015
JP        2015-122351 A    7/2015

*Primary Examiner* — David Vu
(74) *Attorney, Agent, or Firm* — Volpe Koenig

(57) ABSTRACT

An electronic component mounting substrate includes an insulating substrate having a rectangular shape in a plan view of the electronic component mounting substrate, the insulating substrate including a mounting portion on a principal face thereof for mounting an electronic component; and first via conductor groups each including first via conductors and second via conductor groups each including second via conductors, the first via conductors and the second via conductors penetrating through the insulating substrate in a thickness direction thereof, a number of the second via conductors being larger than that of the first via conductors, the mounting portion, the first via conductor groups, and the second via conductor groups being disposed so as not to overlap each other in a transparent plan view of the electronic component mounting substrate, the first via conductor groups being located between the mounting portion and the second via conductor groups, respectively.

15 Claims, 14 Drawing Sheets

(51) Int. Cl.
*H01L 23/12* (2006.01)
*H01L 23/36* (2006.01)
*H01L 23/31* (2006.01)
*H01L 23/00* (2006.01)
H01L 33/62 (2010.01)

(52) U.S. Cl.
CPC .......... *H01L 23/3121* (2013.01); *H01L 23/36* (2013.01); *H01L 23/49822* (2013.01); *H01L 23/49838* (2013.01); *H01L 24/16* (2013.01); H01L 24/48 (2013.01); H01L 33/62 (2013.01); H01L 2224/16225 (2013.01); H01L 2224/16227 (2013.01); H01L 2224/48227 (2013.01); H01L 2924/181 (2013.01); H01L 2924/3511 (2013.01)

(58) Field of Classification Search
CPC ......... H01L 23/13; H01L 24/48; H01L 33/62; H01L 2224/16227; H01L 2224/48227; H01L 2924/3511; H01L 2924/181; H01L 2224/16225; H01L 23/12; H01L 23/36
See application file for complete search history.

(56) References Cited

U.S. PATENT DOCUMENTS

| | | | |
|---|---|---|---|
| 9,082,806 B2 * | 7/2015 | Lin | ............... H01L 21/6835 |
| 10,375,832 B2 * | 8/2019 | Raorane | ............... C23C 14/14 |
| 2004/0253767 A1 | 12/2004 | Nurminen | |
| 2009/0246909 A1 * | 10/2009 | Takeuchi | ............... H01L 21/568 |
| | | | 438/106 |

\* cited by examiner

ELECTRONIC COMPONENT MOUNTING SUBSTRATE, ELECTRONIC DEVICE, AND ELECTRONIC MODULE

TECHNICAL FIELD

The present invention relates to an electronic component mounting substrate, an electronic device, and an electronic module.

BACKGROUND ART

An electronic component mounting substrate in the related art includes a mounting portion which is disposed on one principal face of an insulating substrate and mounts an electronic component thereon, terminal electrodes which are disposed on the other principal face of the insulating substrate, and via conductors which are disposed inside the insulating substrate so as to extend from the mounting portion. In a case where an electronic device including an electronic component and an electronic component mounting substrate is joined to, for example, a module substrate with a joining material such as solder, terminal electrodes are joined to the module substrate via the joining material such as solder (see Japanese Unexamined Patent Publication JP-A 2015-043374).

SUMMARY OF INVENTION

Technical Problem

A need for a more sophisticated and compact electronic device has been increasing in recent years. When a plurality of via conductors are provided densely so as to overlap the mounting portion in a transparent plan view in order to enhance the functionality of an electronic device, heat generated from the electronic component and heat generated from the plurality of via conductors densely provided concentrate and deviation of heat occurs while the electronic device is in operation, in which case the electronic component mounting substrate tends to undergo considerable deformation and distortion. Hence, a concern arises that a contact failure may possibly occur between the electronic component and the electronic component mounting substrate or between the electronic component mounting substrate and the module substrate over a long-term use.

Solution to Problem

According to one aspect of the invention, an electronic component mounting substrate includes an insulating substrate having a rectangular shape in a plan view of the electronic component mounting substrate, the insulating substrate including a mounting portion on a principal face thereof for mounting an electronic component, and first via conductor groups each including a plurality of first via conductors and second via conductor groups each including a plurality of second via conductors, the first via conductors and the second via conductors penetrating through the insulating substrate in a thickness direction of the insulating substrate, a number of the second via conductors being larger than that of the first via conductors, the mounting portion, the first via conductor groups, and the second via conductor groups being disposed so as not to overlap each other in a transparent plan view of the electronic component mounting substrate, the first via conductor groups being located between the mounting portion and the second via conductor groups, respectively.

According to another aspect of the invention, an electronic device includes the electronic component mounting substrate mentioned above, and an electronic component mounted on the mounting portion.

According to still another aspect of the invention, an electronic module includes a module substrate including a connecting pad, and the electronic device mentioned above, the electronic device being connected to the connecting pad via solder.

Advantageous Effects of Invention

The electronic component mounting substrate according to one aspect of the invention includes an insulating substrate having a rectangular shape in a plan view of the electronic component mounting substrate, the insulating substrate including a mounting portion on a principal face thereof for mounting an electronic component, and first via conductor groups each including a plurality of first via conductors and second via conductor groups each including a plurality of second via conductors, the first via conductors and the second via conductors penetrating through the insulating substrate in a thickness direction of the insulating substrate. A number of the second via conductors is larger than that of the first via conductors. The mounting portion, the first via conductor groups, and the second via conductor groups are disposed so as not to overlap each other in a transparent plan view of the electronic component mounting substrate, and the first via conductor groups are located between the mounting portion and the second via conductor groups, respectively. Owing to this configuration, the mounting portion and the second via conductor groups are apart from each other. Accordingly, for example, while an electronic device is in operation, heat generated from the electronic component and heat generated from the second via conductor groups are less prone to concentrate and hence deviation of heat is suppressed. Deformation and distortion of the electronic component mounting substrate can be thus suppressed. Consequently, the electronic component mounting substrate can have excellent reliability by making a connection between the electronic component and the electronic component mounting substrate or between the electronic component mounting substrate and a module substrate satisfactory.

The electronic device according to another aspect of the invention can have excellent long-term reliability by including the electronic component mounting substrate mentioned above and an electronic component mounted on the mounting portion.

The electronic module according to still another aspect of the invention can have excellent long-term reliability by including a module substrate including a connecting pad and the electronic device mentioned above which is connected to the connecting pad via solder.

DESCRIPTION OF EMBODIMENTS

Figure 1A:
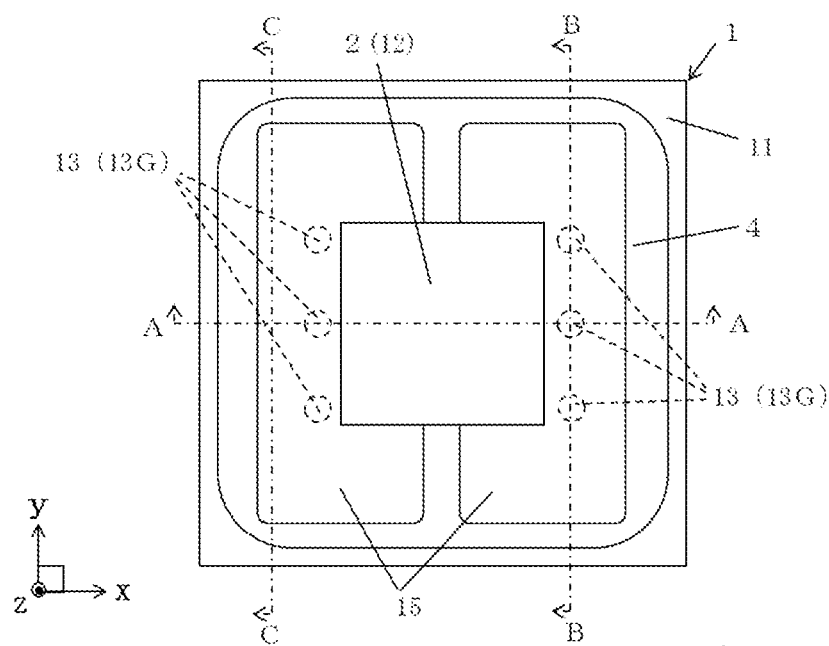
FIG. 1A is a top view of an electronic device according to a first embodiment of the invention.
Figure 1B:
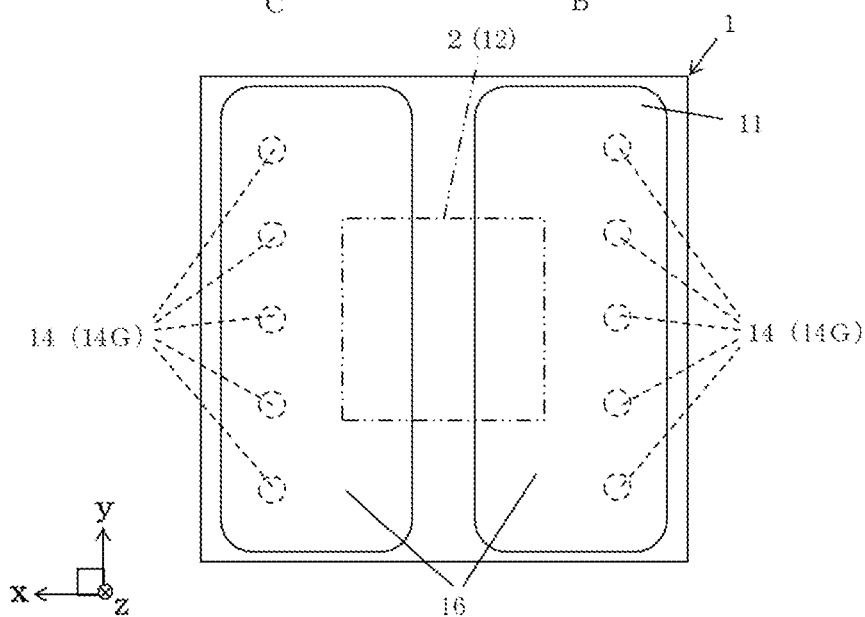
FIG. 1B is a bottom view of FIG. 1A.

Several representative embodiments of the invention will now be described with reference to the accompanying drawings.

First Embodiment

As an example shown in FIG. 1A through FIG. 4, a light-emitting device according to a first embodiment of the invention includes an electronic component mounting substrate 1 and an electronic component 2 disposed on an upper surface of the electronic component mounting substrate 1. As the example shown in FIG. 4, an electronic device is connected to connecting pads 51 on a module substrate 5 constituting, for example, an electronic module, by using a joining material 6.

The electronic component mounting substrate 1 of the present embodiment includes an insulating substrate 11 having a rectangular shape in a plan view of the electronic component mounting substrate 1, the insulating substrate 11 including a mounting portion 12 on a principal face thereof for mounting an electronic component 2, and first via conductor groups 13G each including a plurality of first via conductors 13 and second via conductor groups 14G each including a plurality of second via conductors 14, the first via conductors 13 and the second via conductors 14 penetrating through the insulating substrate 11 in a thickness direction of the insulating substrate 11. A number of the second via conductors 14 is larger than that of the first via conductors 13. The mounting portion 12, the first via conductor groups 13G, and the second via conductor groups 14G are disposed so as not to overlap each other in a transparent plan view of the electronic component mounting substrate 1. The first via conductor groups 13G are located between the mounting portion 12 and the second via conductor groups 14G, respectively. The electronic component mounting substrate 1 also includes mounting electrodes 15 and terminal electrodes 16 on a surface of the insulating substrate 11, and wiring conductors 17 on the surface of and inside the insulating substrate 11. In FIG. 1A through FIG. 4, the electronic device is mounted on an xy plane in a virtual xyz space. In FIG. 1A through FIG. 4, an upward direction means a positive direction on a virtual z axis. In the following, a top and a bottom are distinguished for ease of description and by no means limit actual top and bottom when the electronic component mounting substrate 1 and the like are in practical use.

In the example shown in FIG. 1A, regions where the first via conductors 13 overlap the mounting electrodes 15 in the transparent plan view are indicated by broken lines. In the example shown in FIG. 1B, regions where the second via conductors 14 overlap the terminal electrodes 16 in the transparent plan view are indicated by broken lines. In the example shown in FIG. 2, regions where the first via conductors 13 and the second via conductors 14 overlap the wiring conductors 17 in the transparent plan view are indicated by broken lines.

In the example shown in FIG. 1A through FIG. 3C, the first via conductor group 13G includes three first via conductors 13 and the second via conductor group 14G includes five second via conductors 14. The electronic component mounting substrate 1 includes a pair of the first via conductor groups 13G and a pair of the second via conductor groups 14G, each pair being disposed to oppose each other with the mounting portion 12 in between.

The insulating substrate 11 includes one principal face (upper surface in FIG. 1A through FIG. 3C) and the other principal face (lower surface in FIG. 1A through FIG. 3C). In a plan view, the insulating substrate 11 is of a rectangular plate shape having two sets of opposing sides (four sides) in each of the one principal face and the other principal face. The insulating substrate 11 functions as a supporting body for supporting the electronic component 2. The electronic component 2 is bonded and fixed onto the mounting electrodes 15 disposed on the one principal face of the insulating substrate 11 via connecting members 3 such as solder bumps.

The insulating substrate 11 can be formed of, for example, ceramics such as an aluminum oxide-based sintered body (alumina ceramics), an aluminum nitride-based sintered body, a mullite-based sintered body, or a glass ceramics sintered body. For example, in a case where the insulating substrate 11 is formed of an aluminum oxide-based sintered body, appropriate organic binder, solvent, and so on are added and mixed to raw powder such as aluminum oxide (Al$_2$O$_3$), silicon oxide (SiO$_2$), magnesium oxide (MgO), or calcium oxide (CaO) to produce a slurry. The slurry is shaped into a sheet by adopting the doctor blade method or the calendar roll method known in the art to produce a ceramic green sheet. Subsequently, appropriate punching is applied to the ceramic green sheet and a green molded body is formed by laminating a plurality of ceramic green sheets as needed. The insulating substrate 11 formed of a plurality of insulating layers 11a is manufactured by firing the green molded body at a high temperature (approximately 1600° C.)

The first via conductors 13, the second via conductors 14, the mounting electrodes 15, the terminal electrodes 16, and the wiring conductors 17 electrically connect an electronic component 2 mounted on the mounting portion 12 of the electronic component mounting substrate 1 and the module substrate 5. Also, the mounting electrodes 15 join the electronic component mounting substrate 1 and the electronic component 2. The terminal electrodes 16 join the electronic component mounting substrate 1 and the module substrate 5. The plurality of first via conductors 13 (first via conductor group 13G) connect to the mounting electrodes 15, and the plurality of second via conductors 14 (second via conductor group 14G) connect to the terminal electrodes 16. The wiring conductors 17 are disposed inside the insulating substrate 11, that is, between the insulating layers 11a and connect the plurality of first via conductors 13 (first via conductor group 13G) and the plurality of second via conductors 14 (second via conductor group 14G).

The first via conductor group 13G includes three to five first via conductors 13 and the second via conductor group 14G includes four to eight second via conductors 14. The second via conductors 14 constituting the second via conductor group 14G include one to three more via conductors than a number of the first via conductors 13 constituting the first via conductor group 13G. The first via conductor group 13G and the second via conductor group 14G are disposed on different insulating layers 11a so as not to overlap in a transparent plan view and in a planar direction (in a transparent side view). In the transparent plan view, the first via conductor group 13G is disposed between the mounting portion 12 and the second via conductor group 14G. In the transparent plan view, the first via conductor group 13G is located in a region which accounts for 30% to 70% of a region between the mounting portion 12 and the second via conductor group 14G. It is preferable for the first via conductor group 13G that the first via conductors 13 (first via conductor group 13G) are located in a center region in the region between the mounting portion 12 and the second via conductor group 14G in the transparent plan view, that is, on a virtual center line between the mounting portion 12 and the second via conductor group 14G.

A material for forming the first via conductors 13, the second via conductors 14, the mounting electrodes 15, the terminal electrodes 16, and the wiring conductors 17 is metalized metal powder containing, for example, tungsten (W), molybdenum (Mo), manganese (Mn), silver (Ag), or copper (Cu) as a main component. The first via conductors 13 and the second via conductors 14 are formed by, for example, making through-holes for the first via conductors 13 and the second via conductors 14 in a ceramic green sheet for the insulating substrate 11 by using a die or by a processing method such as punching or laser processing, filling the through-holes with metallized paste for the first via conductors 13 and the second via conductors 14 by printing means such as screen printing, and firing the metallized paste with the ceramic green sheet for the insulating substrate 11. The mounting electrodes 15, the terminal electrodes 16, and the wiring conductors 17 are formed by, for example, applying metallized paste for the mounting electrodes 15, the terminal electrodes 16, and the wiring conductors 17 on the ceramic green sheet for the insulating substrate 11 by printing means such as screen printing, and firing the metallized paste with the ceramic green sheet for the insulating substrate 11. The metallized paste is produced by adding appropriate solvent and binder to the metal powder and kneading the mixture until the mixture is adjusted to appropriate viscosity. Glass powder and ceramic powder may be included to increase joint strength to the insulating substrate 11.

Surfaces of the mounting electrodes 15, the terminal electrodes 16, and the wiring conductors 17 exposed from the insulating substrate 11 are covered with a metal-plated layer of nickel, gold, or the like with excellent corrosion resistance. By covering the exposed surfaces, corrosion of the mounting electrodes 15, the terminal electrodes 16, and the wiring conductors 17 can be reduced, and the mounting electrodes 15 and the electronic component 2 can be joined, the mounting electrodes 15 and the connecting members 3 can be connected, or the module substrate 5 and the terminal electrodes 16 can be joined more firmly. For example, the surfaces of the mounting electrodes 15, the terminal electrodes 16, and the wiring conductors 17 exposed from the insulating substrate 11 are alternately covered with a nickel-plated layer of approximately 1 to 10 µm thick and a gold-plated layer of approximately 0.1 to 3 µm thick.

The plated layers are not limited to a combination of a nickel-plated layer and a gold-plated layer, and may be a combination of other plated layers such as a combination of a nickel-plated layer, a gold-plated layer, and a silver-plated layer, or a combination of a nickel-plated layer, palladium-plated layer, and a gold-plated layer.

As an underlayer of, for example, the nickel-plated layer and the gold-plated layer, a metal-plated layer, for example, a copper-plated layer of approximately 10 to 80 µm thick may cover the mounting electrodes 15 where the electronic component 2 is mounted, in which case heat of the electronic component 2 is dissipated more readily in a satisfactory manner toward the electronic component mounting substrate 1 via the copper-plated layer.

As an underlayer of, for example, the nickel-plated layer and the gold-plated layer, a metal-plated layer, for example, a copper-plated layer of approximately 10 to 80 µm thick may cover the terminal electrodes 16, in which case heat of the electronic component mounting substrate 1 is dissipated more readily in a satisfactory manner toward the module substrate 5 via the copper-plated layer.

The electronic device can be manufactured by mounting the electronic component 2 on the mounting electrodes 15 disposed on the one principal face of the electronic component mounting substrate 1. The electronic component 2 mounted on the electronic component mounting substrate 1 is a semiconductor element such as an IC chip or an LSI chip, a light-emitting element, a piezoelectric element such as a crystal oscillator or a piezoelectric vibrator, or every type of sensor. For example, in a case where the electronic component 2 is a flip-chip semiconductor element, the semiconductor element is mounted on the electronic component mounting substrate 1 by mechanically connecting electrodes of the semiconductor element and the mounting electrodes 15 via the connecting members 3 such as solder bumps, gold bumps, or conductive resin (anisotropic conductive resin). For example, in another case where the electronic component 2 is a wire-bonding semiconductor element, the semiconductor element is mounted on the electronic component mounting substrate 1 by firstly fixing the semiconductor element on one of the mounting electrodes 15 where the electronic component 2 is to be mounted by a joining member such as low-melting-point brazing filler metal or conductive resin, and subsequently electrically connecting electrodes of the semiconductor element and the other one of the mounting electrodes 15 via the connecting members 3 such as bonding wires. A plurality of electronic components 2 may be mounted on the electronic component mounting substrate 1 and other electronic components, such as a resistance element, a capacitive element, and a Zener diode, may be mounted as needed. The electronic component 2 is encapsulated as needed by an encapsulation member 4 formed of resin, glass, or the like, or by a lid formed of resin, glass, ceramics, metal, or the like.

Figure 4:
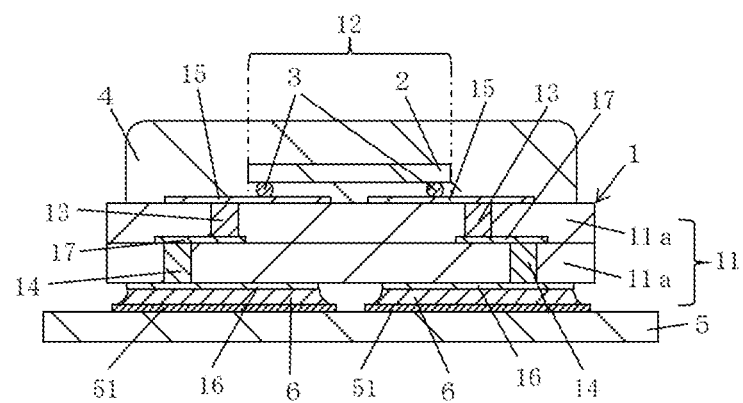
FIG. 4 is a longitudinal sectional view of an electronic module using the electronic device of FIGS. 1A and 1B and mounted on a module substrate.
Figure 5A:
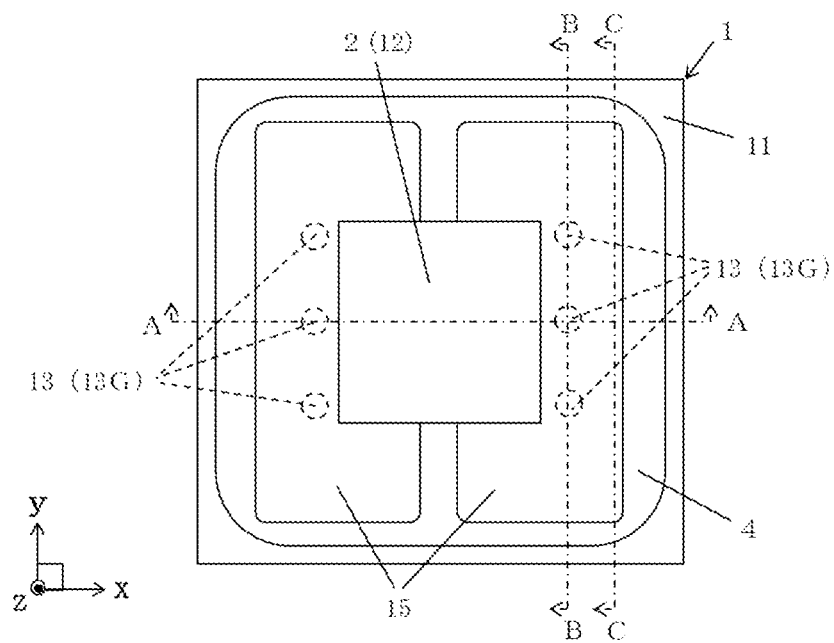
FIG. 5A is a top view of an electronic device according to a second embodiment of the invention.
Figure 5B:
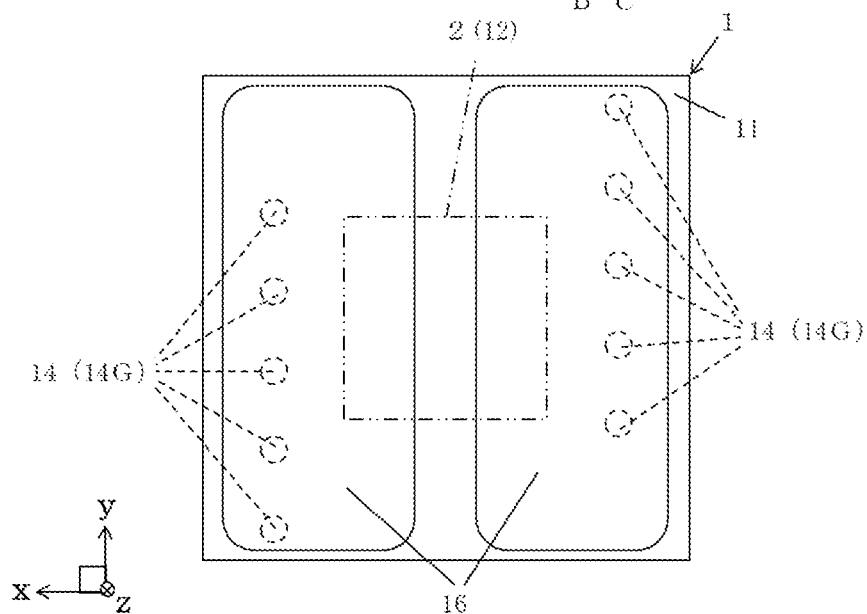
FIG. 5B is a bottom view of FIG. 5A.
Figure 6:
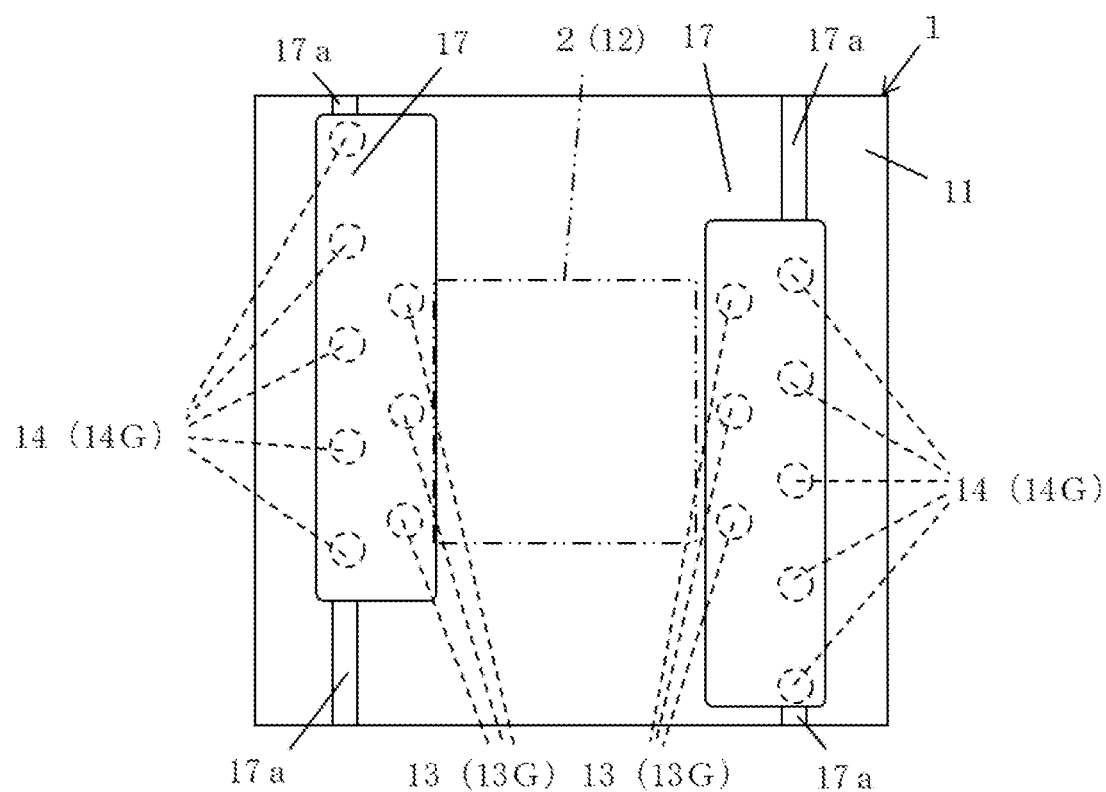
FIG. 6 is an internal top view of an electronic component mounting substrate in the electronic device shown in FIGS. 5A and 5B.
Figure 6:
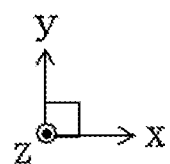

As the example shown in FIG. 4, the electronic device of the present embodiment is connected to the connecting pads 51 of the module substrate 5 via the joining material 6 such as solder, and forms an electronic module.

The electronic component mounting substrate 1 of the present embodiment includes the insulating substrate 11 having a rectangular shape in a plan view thereof, the insulating substrate 11 including the mounting portion 12 on a principal face thereof for mounting the electronic component 2, and the first via conductor group 13G including the plurality of first via conductors 13 and the second via conductor group 14G including the plurality of second via conductors 14, the first via conductors 13 and the second via conductors 14 being penetrating through the insulating substrate 11 in a thickness direction of the electronic component mounting substrate 1. A number of the second via conductors 14 is larger than that of the first via conductors 13. The mounting portion 12, the first via conductor group 13G, and the second via conductor group 14G are disposed so as not to overlap each other in a transparent plan view and the first via conductor group 13G is located between the mounting portion 12 and the second via conductor group 14G. Owing to this configuration, the mounting portion 12 and the second via conductor group 14G are apart from each other. Accordingly, for example, while the electronic device is in operation, heat generated from the electronic component 2 and heat generated from the second via conductor group 14G are less prone to concentrate and hence deviation of heat is suppressed. Deformation and distortion of the electronic component mounting substrate 1 can be thus suppressed. Consequently, the electronic component mounting substrate 1 can have excellent reliability by making a connection between the electronic component 2 and the electronic component mounting substrate 1 or between the electronic component mounting substrate 1 and the module substrate 5 satisfactory.

In a transparent plan view and in a planar direction (in a transparent side view), the first via conductor group 13G including the first via conductors 13 fewer than the second via conductors 14 is located between the mounting portion 12 and the second via conductor group 14G. Accordingly, for example, while the electronic device is in operation, heat generated from the electronic component 2, the first via conductor group 13G, and the second via conductor group 14G is less prone to concentrate and hence deviation of heat is suppressed. Also, in a transparent plan view and in a planar direction (in a transparent side view), the first via conductor group 13G having a relatively small amount of heat generation is located between the mounting portion 12 and the second via conductor group 14G. Hence, deviation of heat is suppressed further. Deformation and distortion of the electronic component mounting substrate 1 can be thus suppressed. Consequently, the electronic component mounting substrate 1 can have excellent reliability by making a connection between the electronic component 2 and the electronic component mounting substrate 1 or between the electronic component mounting substrate 1 and the module substrate 5 satisfactory.

The electronic component mounting substrate 1 of the present embodiment can be suitably used in a thin, high-output electronic device and reliability of the electronic component mounting substrate 1 can be enhanced. For example, in a case where a light-emitting element is mounted as the electronic component 2, the electronic component mounting substrate 1 can be suitably used for a thin, high-luminance light-emitting device.

The number of the first via conductors 13 in the insulating substrate 11 is smaller than the number of the second via conductors 14. Hence, the electronic component 2 can be mounted on the mounting portion 12 more readily in a satisfactory manner by reducing the number of via conductors extending to the principal face where the mounting portion 12 is provided. Consequently, the electronic component mounting substrate 1 can be used suitably in a smaller size.

When the second via conductor group 14G is provided in a strip shape along an outer edge of the insulating substrate 11 in a transparent plan view, heat generated from the second via conductor group 14G can be dissipated more readily toward a side surface of the insulating substrate 11. Also, the mounting portion 12 and the second via conductor group 14G are further apart from each other. Accordingly, heat generated from the electronic component 2 and heat generated from the second via conductor group 14G are further less prone to concentrate and hence local deviation of heat is suppressed further. Deformation and distortion of the electronic component mounting substrate 1 can be thus suppressed.

A phrase, "the second via conductor group 14G is provided in a strip shape", means that the plurality of second via conductors 14 constituting the second via conductor group 14G are disposed side by side.

Also, when the first via conductor group 13G is provided in a strip shape in a transparent plan view, local deviation of heat generated from the plurality of first via conductors 13 can be suppressed. Deformation and distortion of the electronic component mounting substrate 1 can be thus suppressed. Further, when the first via conductor group 13G is provided parallel to the outer edge of the insulating substrate 11 in a transparent plan view, local deviation of heat generated from the plurality of first via conductors 13 can be suppressed further. Deformation and distortion of the electronic component mounting substrate 1 can be thus suppressed further.

A phrase, "the first via conductor group 13G is provided in a strip shape", means that the plurality of first via conductors 13 constituting the first via conductor group 13G are disposed side by side.

Figure 2:
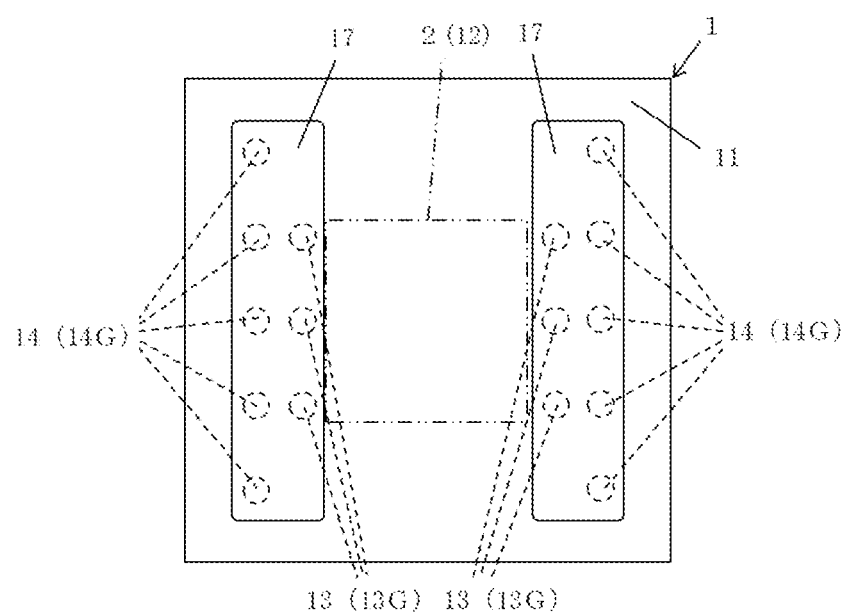
FIG. 2 is an internal top view of an electronic component mounting substrate in the electronic device shown in FIG. 1A.
Figure 3A:
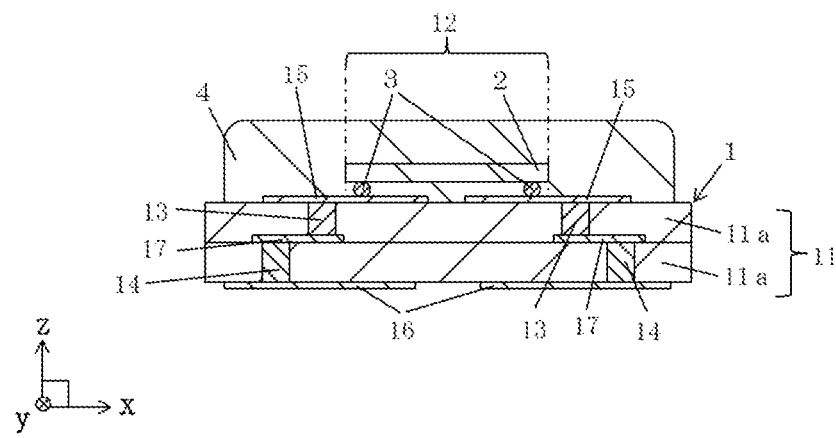
FIG. 3A is an end view of the electronic device shown in FIG. 1A at a portion cut longitudinally along the line A-A.
Figure 3B:
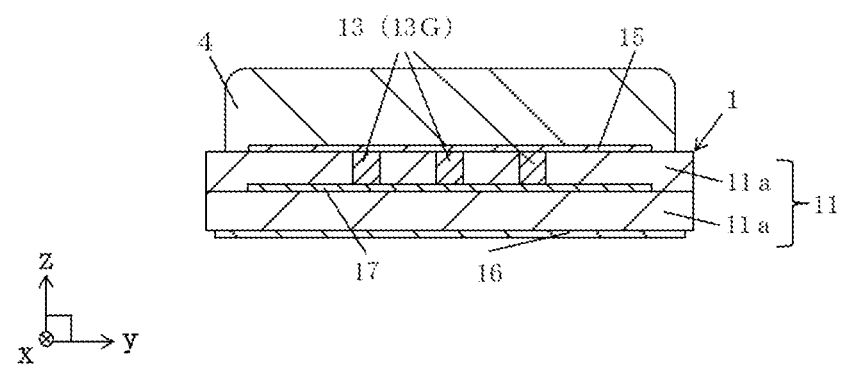
FIG. 3B is a longitudinal sectional view of the electronic device shown in FIG. 1A taken along the line B-B.
Figure 3C:
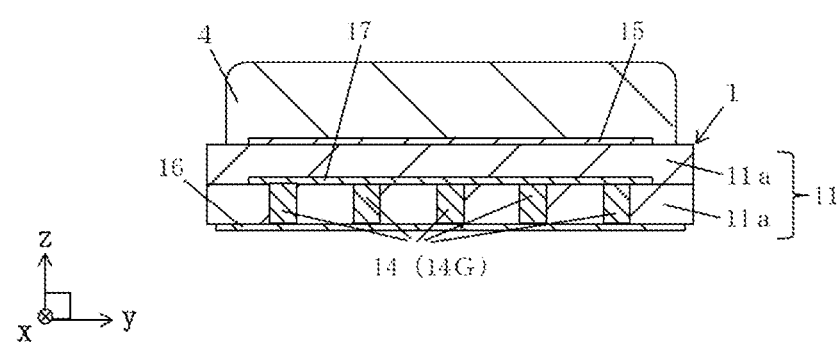
FIG. 3C is an end view of the electronic device shown in FIG. 1A at a portion cut longitudinally along the line C-C.

When the second via conductor groups 14G are located so as to oppose each other in a transparent plan view as shown in FIG. 2, deviation of heat generated from the respective second via conductor groups 14G can be suppressed. Deformation and distortion of the electronic component mounting substrate 1 can be thus suppressed.

When the first via conductor groups 13G are located so as to oppose each other in a transparent plan view as shown in FIG. 2, deviation of heat generated from the respective first via conductor groups 13G can be suppressed. Deformation and distortion of the electronic component mounting substrate 1 can be thus suppressed.

It is preferable that in the first via conductors 13, adjacent first via conductors 13 are disposed at equal intervals in a transparent plan view, because concentration of heat generated from the plurality of first via conductors 13 is suppressed and deformation and distortion of the electronic component mounting substrate 1 can be suppressed. Likewise, it is preferable that in the second via conductors 14, adjacent second via conductors 14 are disposed at equal intervals in a transparent plan view.

As the example shown in FIG. 2, when an interval between the adjacent first via conductors 13 is larger than an interval between the first via conductors 13 and the second via conductors 14 in a transparent plan view, heat can be restrained from stagnating in the plurality of first via conductors 13, and local deviation of heat in the first via conductor group 13G can be suppressed. Therefore, deformation and distortion of the electronic component mounting substrate 1 can be thus suppressed.

As in the example shown in FIG. 2, an entire connection of the plurality of first via conductors 13 and the plurality of second via conductors 14 is made satisfactory by forming the wiring conductors 17 in a transparent plan view larger than a region of the first via conductor group 13G and a region of the second via conductor group 14G to which the wiring conductors 17 are to be connected. Consequently, deviation of heat is suppressed and deformation and distortion of the electronic component substrate 1 can be suppressed.

The electronic device of the present embodiment comprises the electronic component mounting substrate 1 mentioned above and an electronic component 2 mounted on the mounting portion 12. Owing to this configuration, electrical reliability can be enhanced.

The electronic module of the present embodiment comprises the module substrate 5 including the connecting pad 51 and the electronic device described above which is connected to the connecting pad 51 via the solder 6. Owing to this configuration, the electric module can have excellent long-term reliability.

Second Embodiment

An electronic device according to a second embodiment of the invention will now be described with reference to FIG. 5A through FIG. 7C.

The electronic device according to the second embodiment of the invention is different from the electronic device of the above embodiment in that, as an example shown in FIG. 5A through FIG. 7C, one end of a second via conductor group 14G is located closer to a corner of an insulating substrate 11.

In the example shown in FIG. 5A through FIG. 7C, a first via conductor group 13G includes three first via conductors 13, and the second via conductor group 14G includes four second via conductors 14. An electronic component mounting substrate 1 includes a pair of first via conductor groups 13G and a pair of second via conductor groups 14G.

In the electronic component mounting substrate 1 according to the second embodiment of the invention, as in the first embodiment, a mounting portion 12 and the second via conductor group 14G are apart from each other. Accordingly, for example, while the electronic device is in operation, heat generated from an electronic component 2 and heat generated from the second via conductor group 14G are less prone to concentrate and hence deviation of heat is suppressed. Deformation and distortion of the electronic component mounting substrate 1 can be thus suppressed. Consequently, the electronic component mounting substrate 1 can have excellent reliability by making a connection between the electronic component 2 and the electronic component mounting substrate 1 or between the electronic component mounting substrate 1 and the module substrate 5 satisfactory.

In a case where one end of the second via conductor group 14G is located closer to a corner of the insulating substrate 11, in a transparent plan view, a center of the second via conductor group 14G is displaced toward the corner of the insulating substrate 11 from a center of an outer edge (one side) of the insulating substrate 11 on a periphery of the second via conductor group 14G.

As an example shown in FIG. 8A through FIG. 10C, by providing a pair of second via conductor groups 14G opposing each other with an electronic component 2 in between to locate one end of each pair at diagonal corners of the insulating substrate 11, heat is less prone to concentrate on one side of the insulating substrate 11 and hence deviation of heat is suppressed in comparison with a case where a pair of the second via conductor groups 14G opposing each other is provided by displacing one end of each to corners of the insulating substrate 11 on a same side. Deformation and distortion of the electronic component mounting substrate 1 can be thus suppressed.

As the example shown in FIG. 8A through FIG. 10C, when first via conductor groups 13G are located closer to corners different from the corners where the second via conductor groups 14G are disposed, heat generated from the second via conductor groups 14G can be more readily dissipated toward both side surfaces of the insulating substrate 11, and heat generated from the first via conductor groups 13G and heat generated from the second via conductor groups 14G are less prone to concentrate and hence deviation of heat is suppressed. Deformation and distortion of the electronic component mounting substrate 1 can be thus suppressed.

When the first via conductor group 13G is located closer to a corner of the insulating substrate 11, in a case of an electronic device in which the electronic component 2 and mounting electrodes 15 are connected via connecting members 3 such as bonding wires, a plurality of first via conductors 13 are displaced to one corner and a connecting region of the connecting members 3 such as bonding wires, can be enlarged in a region where the first via conductors 13 are not provided, that is, at the other corner. Hence, the electronic device can have excellent reliability in connection between the connecting members 3 and the mounting electrodes 15.

As are shown in FIG. 6, FIGS. 7A through 7C, FIG. 9, and FIGS. 10A through 10C, when wiring conductors 17 include extending portions 17a extending to side surfaces of the insulating substrate 11, heat generated from the first via conductor group 13G and the second via conductor group 14G is more readily dissipated toward the side surfaces of the insulating substrate 11, and therefore deviation of heat is suppressed. Deformation and distortion of the electronic component mounting substrate 1 can be thus suppressed.

Figure 7A:
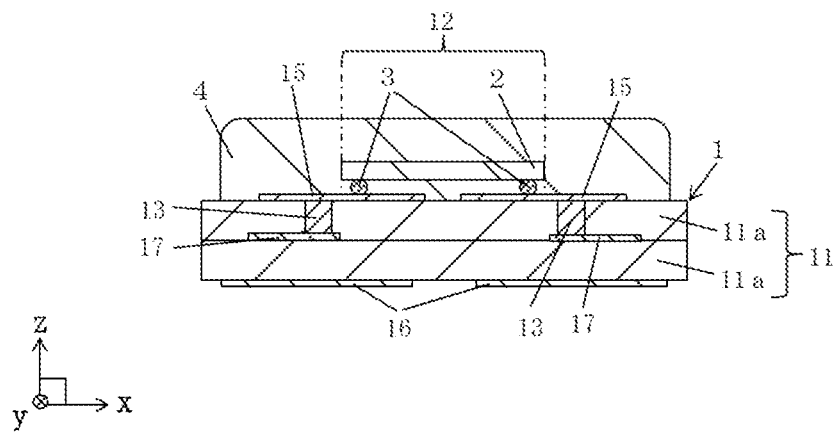
FIG. 7A is an end view of the electronic device shown in FIG. 5A at a portion cut longitudinally along the line A-A.
Figure 7B:
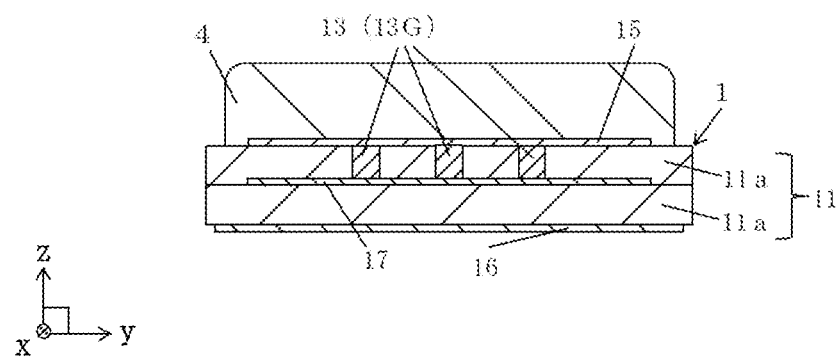
FIG. 7B is a longitudinal sectional view of the electronic device shown in FIG. 5A taken along the line B-B.
Figure 7C:
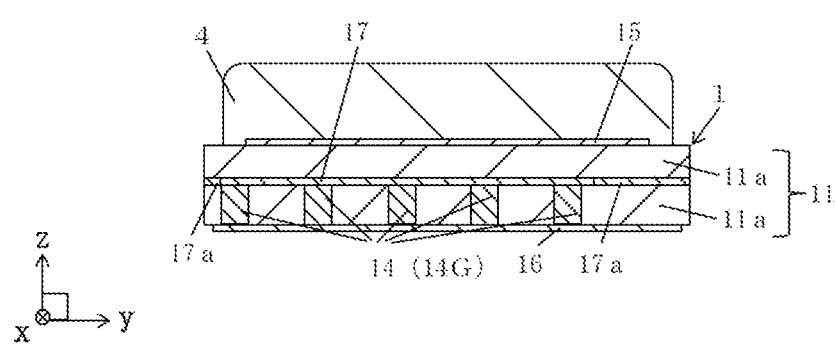
FIG. 7C is an end view of the electronic device shown in FIG. 5A at a portion cut longitudinally along the line C-C.
Figure 8A:
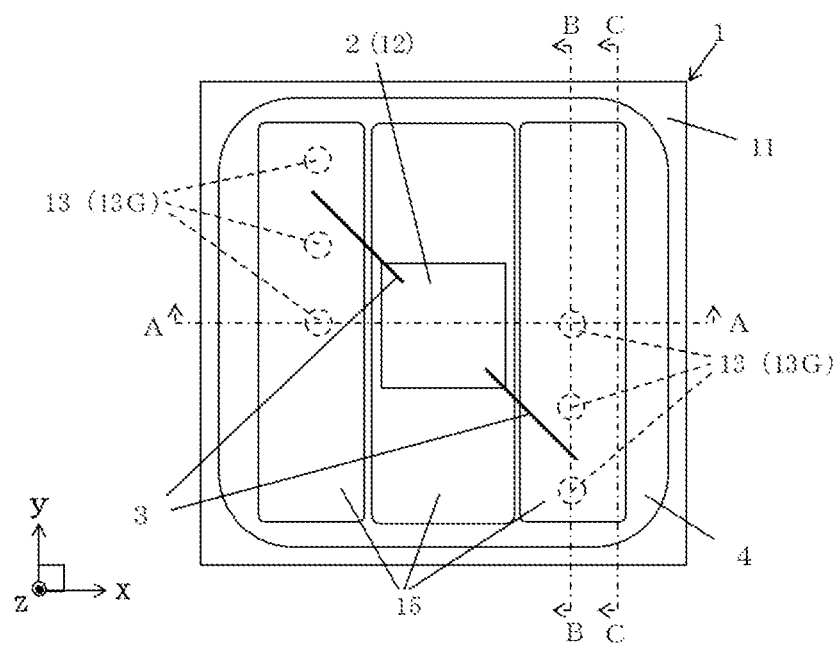
FIG. 8A is a top view of an electronic device in another example according to the second embodiment of the invention.
Figure 8B:
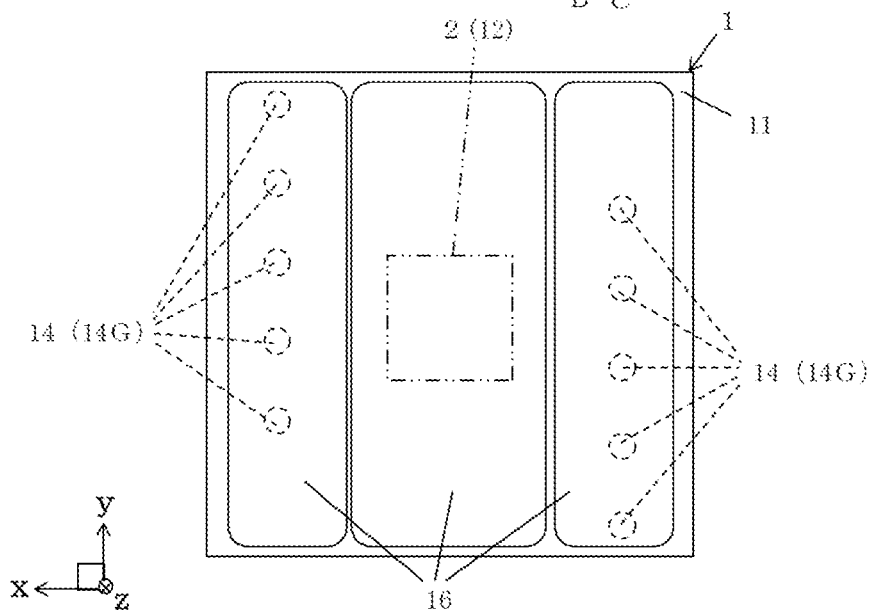
FIG. 8B is a bottom view of FIG. 8A.
Figure 9:
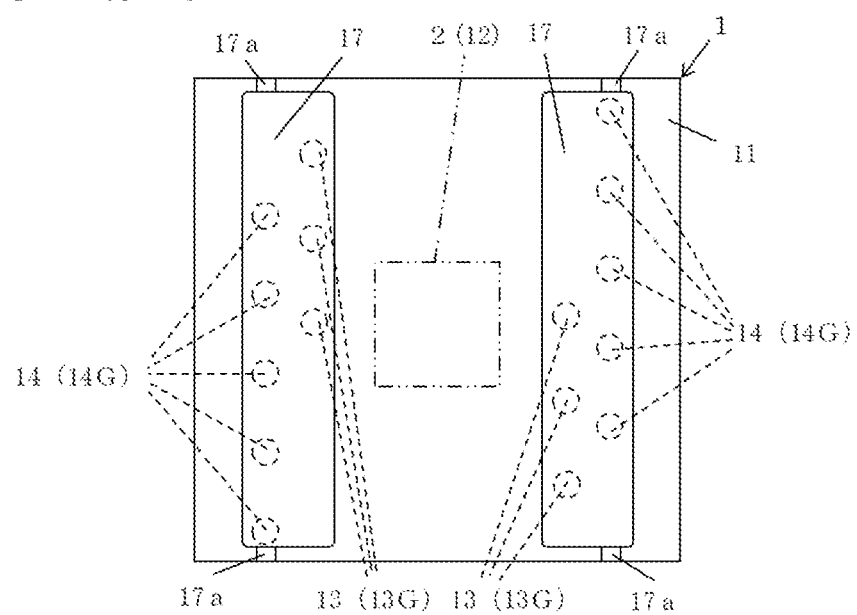
FIG. 9 is an internal top view of an electronic component mounting substrate in the electronic device shown in FIGS. 8A and 8B.
Figure 9:
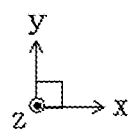
Figure 10A:
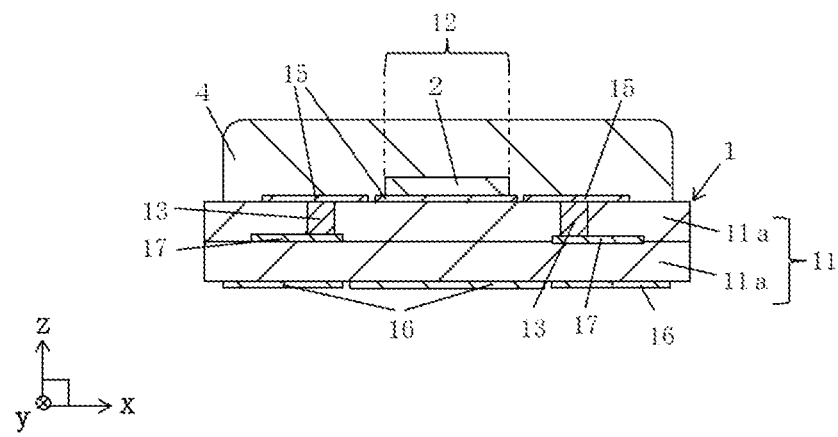
FIG. 10A is an end view of the electronic device shown in FIG. 8A at a portion cut longitudinally along the line A-A.
Figure 10B:
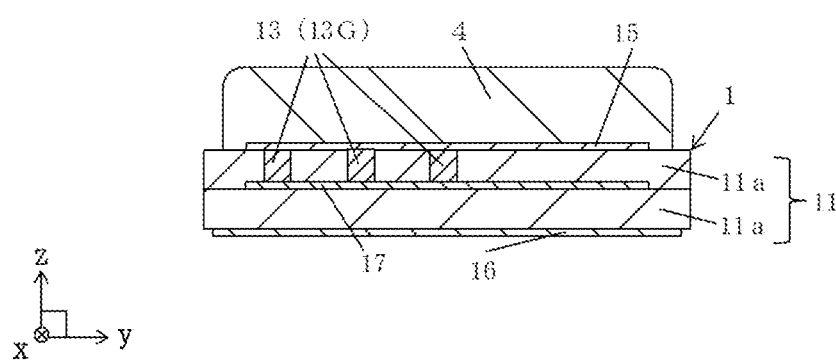
FIG. 10B is a longitudinal sectional view of the electronic device shown in FIG. 8A taken along the line B-B.
Figure 10C:
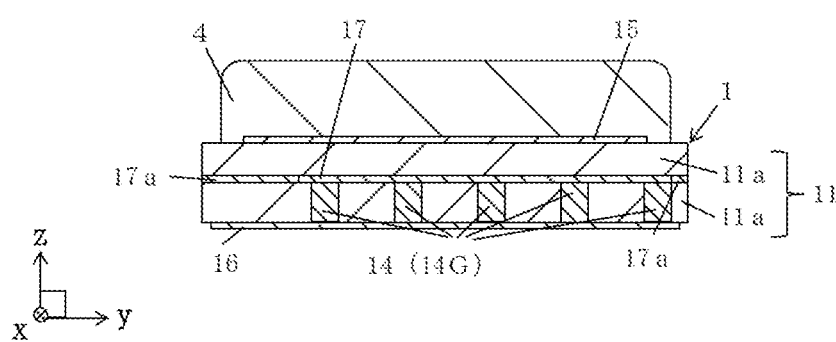
FIG. 10C is an end view of the electronic device shown in FIG. 8A at a portion cut longitudinally along the line C-C.
Figure 11A:
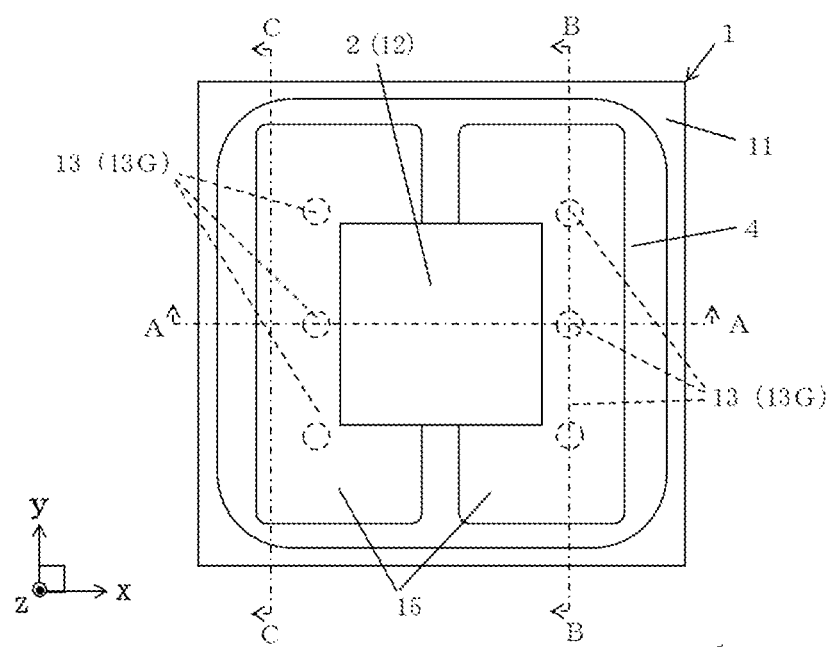
FIG. 11A is a top view of an electronic device according to a third embodiment of the invention.
Figure 11B:
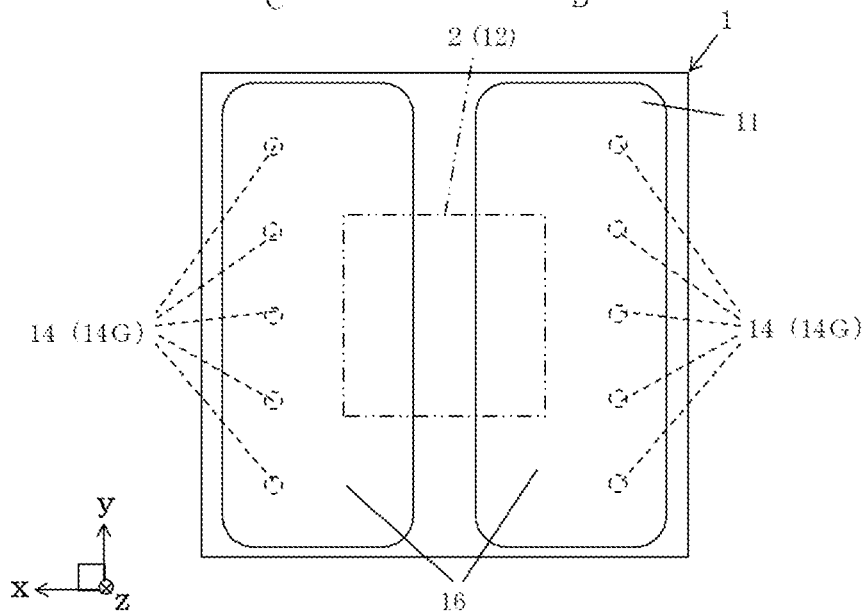
FIG. 11B is a bottom view of FIG. 11A.
Figure 12:
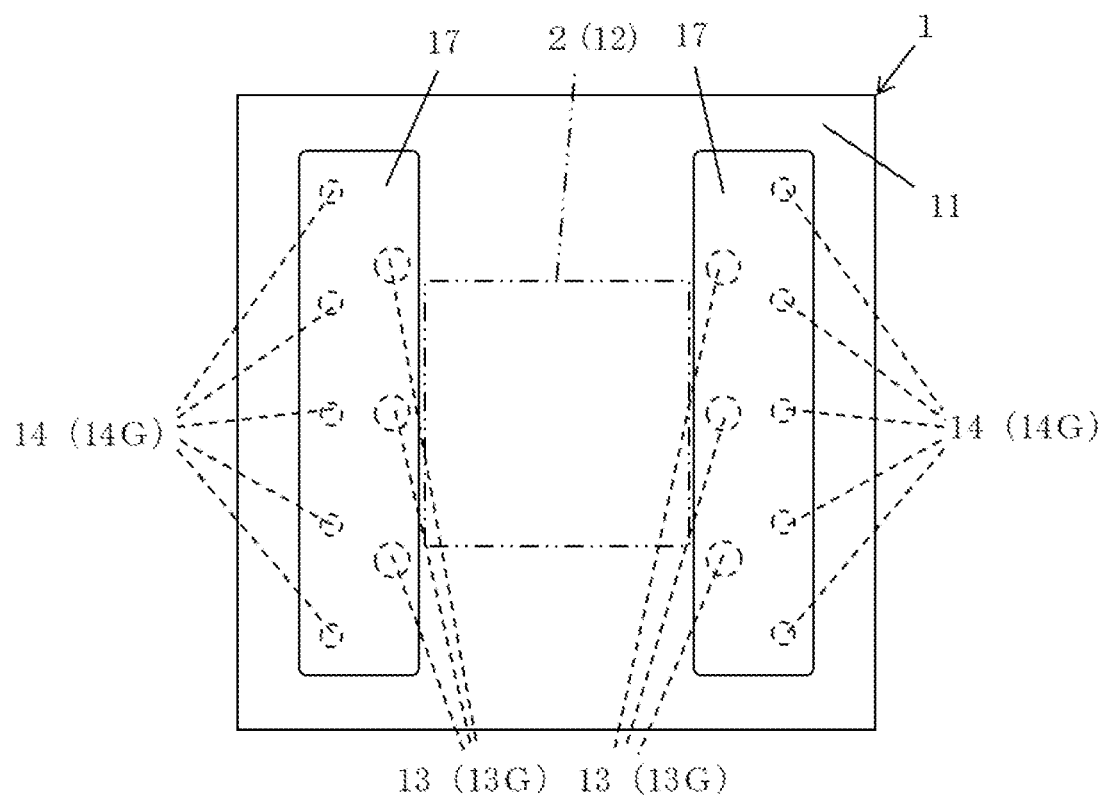
FIG. 12 is an internal top view of an electronic component mounting substrate in the electronic device shown in FIGS. 11A and 11B.
Figure 12:
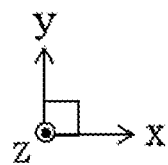
Figure 13A:
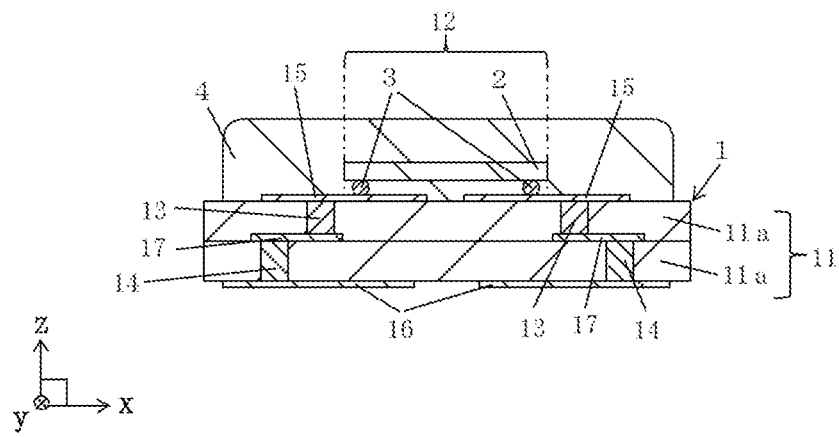
FIG. 13A is an end view of the electronic device shown in FIG. 11A at a portion cut longitudinally along the line A-A.
Figure 13B:
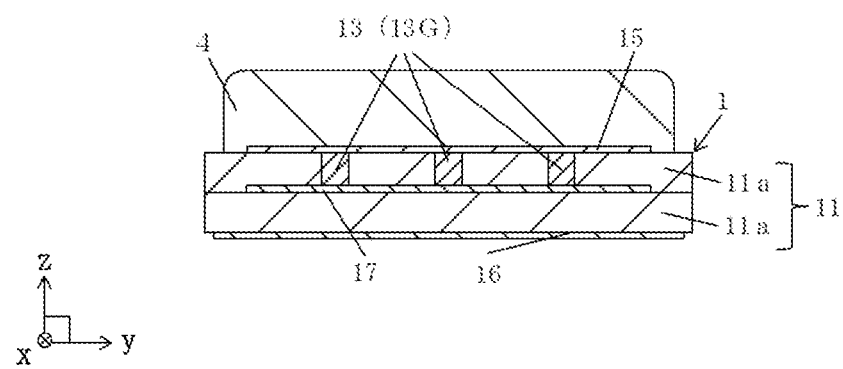
FIG. 13B is an end view of the electronic device shown in FIG. 11A at a portion cut longitudinally along the line B-B.
Figure 13C:
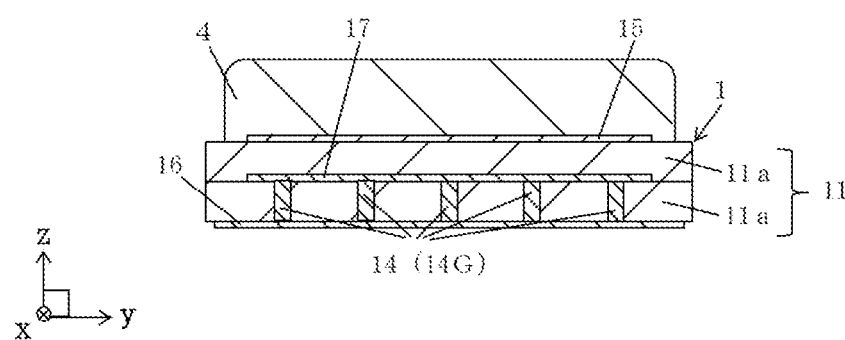
FIG. 13C is an end view of the electronic device shown in FIG. 11A at a portion cut longitudinally along the line C-C.

In the example shown in FIG. 6 and FIG. 7A through 7C, the extending portions 17a are provided in a direction the same as a direction in which the plurality of first via conductors 13 or the plurality of second via conductors 14 are disposed (aligned) (in a Y direction in FIGS. 7A through 7C). However, the extending portions 17a may further extend to side surfaces of the insulating substrate 11 on sides orthogonal to the arrangement (alignment) of the second via conductors 14 (an X direction in FIGS. 7A through 7C).

The extending portions 17a are formed of the same material as that of the wiring conductor 17 by the same method as that of the wiring conductors 17 and are formed smaller than the wiring conductors 17 in width.

The electronic component mounting substrate 1 of the second embodiment can be suitably used in a thin, high-output electronic device and reliability of the electronic component mounting substrate 1 can be enhanced. For example, in a case where a light-emitting element is mounted as the electronic component 2, the electronic component mounting substrate 1 can be suitably used for a thin, high-luminance light-emitting device.

The electronic component mounting device 1 of the second embodiment can be manufactured by a manufacturing method the same as the manufacturing method of the electronic component mounting substrate 1 of the first embodiment mentioned above.

Third Embodiment

An electronic device according to a third embodiment of the invention will now be described with reference to FIG. 11A through FIG. 13C.

The electronic device according to the third embodiment of the invention is different from the electronic devices of the above embodiments in that, as an example shown in FIG. 11A through FIG. 13C, a diameter of each of first via conductors 13 and a diameter of each of second via conductors 14 are different from each other. In the example shown in FIG. 11A through FIG. 13C, a diameter of each of the first via conductors 13 is larger than a diameter of each of the second via conductors 14.

In the electronic component mounting substrate 1 according to the third embodiment of the invention, as in the first embodiment, a mounting portion 12 and a second via conductor group 14G are apart from each other. Accordingly, for example, while the electronic device is in operation, heat generated from an electronic component 2 and heat generated from the second via conductor group 14G are less prone to concentrate and hence deviation of heat is suppressed. Deformation and distortion of the electronic component mounting substrate 1 can be thus suppressed. Consequently, the electronic component mounting substrate 1 can have excellent reliability by making a connection between the electronic component 2 and the electronic component mounting substrate 1 or between the electronic component mounting substrate 1 and the module substrate 5 satisfactory.

Because the diameter of each of the first via conductors 13 is larger than the diameter of each of the second via conductors 14, heat resistance of the first via conductors 13 becomes smaller. Hence, heat generated from a first via conductor group 13G is suppressed further and deviation of heat is suppressed. Deformation and distortion of the electronic component mounting substrate 1 can be thus suppressed.

In the case described above, the diameter of each of the first via conductors 13 is preferably approximately 1.05 to 2 times the diameter of each of the second via conductors 14.

Because the diameter of each of the plurality of second via conductors 14 located closer to an outer edge of the insulating substrate 11 is smaller, cracking is less prone to occur between adjacent second via conductors 14 or between the second via conductors 14 and the outer edge of the insulating substrate 11 in comparison with a case where the diameter of each of the second via conductors 14 is made as large as the diameter of each of the first via conductors 13. Consequently, a larger number of the second via conductors 14 can be disposed inside the electronic component mounting substrate 1 or the electronic component mounting substrate 1 can be manufactured in a smaller size.

In the electronic component mounting substrate 1 of the third embodiment, by making an area of the first via conductor group 13G in a transparent plan view (a total area of the first via conductors 13 in a transparent plan view) larger than an area of the second via conductor group 14G in a transparent plan view (a total area of the second via conductors 14 in a transparent plan view), heat resistance at the first via conductor group 13G becomes smaller, in which case heat generated from the first via conductor group 13G is suppressed further and hence deviation of heat is suppressed. Deformation and distortion of the electronic component mounting substrate 1 can be thus suppressed.

The electronic component mounting substrate 1 of the third embodiment can be suitably used in a thin, high-output electronic device and reliability of the electronic component substrate 1 can be enhanced. For example, in a case where a light-emitting element is mounted as the electronic component 2, the electronic component mounting substrate 1 can be suitably used for a thin, high-luminance light-emitting device.

The electronic component mounting substrate 1 of the third embodiment can be manufactured by a manufacturing method the same as the manufacturing method of the electronic component mounting substrates 1 of the above embodiments.

Fourth Embodiment

An electronic device according to a forth embodiment of the invention will now be described with reference to FIGS. 14A through 14C.

Figure 14A:
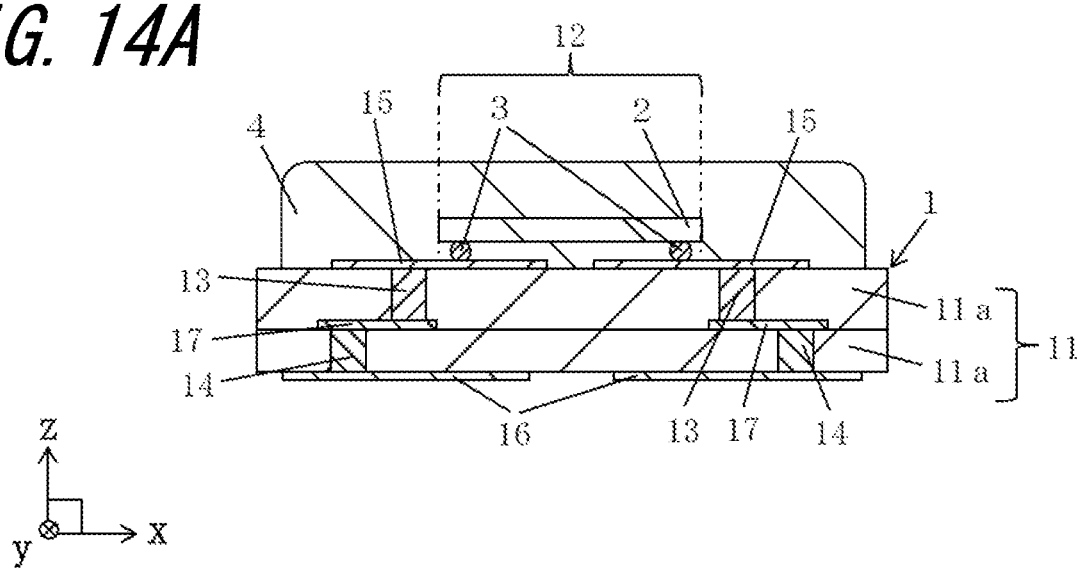
FIGS. 14A through 14C are longitudinally cut end view of an electronic device according to a fourth embodiment of the invention.
Figure 14B:
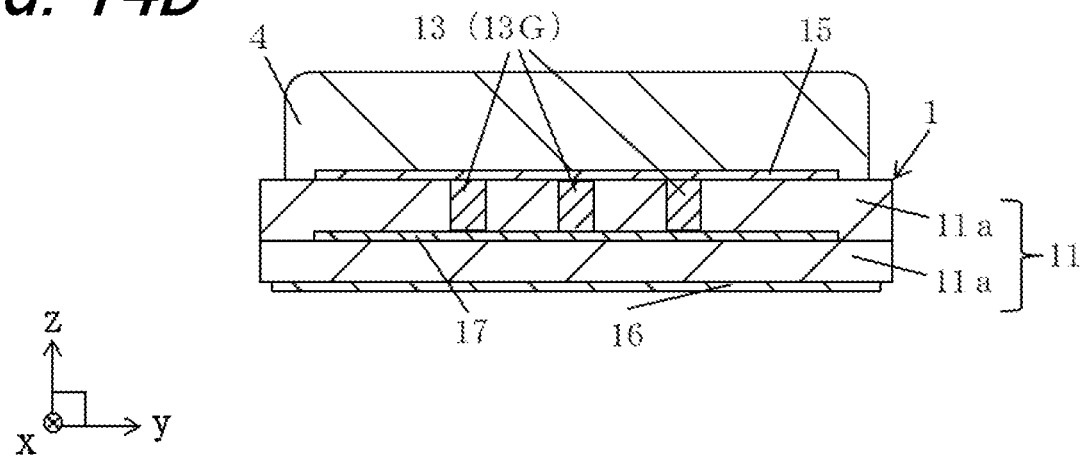
Figure 14C:
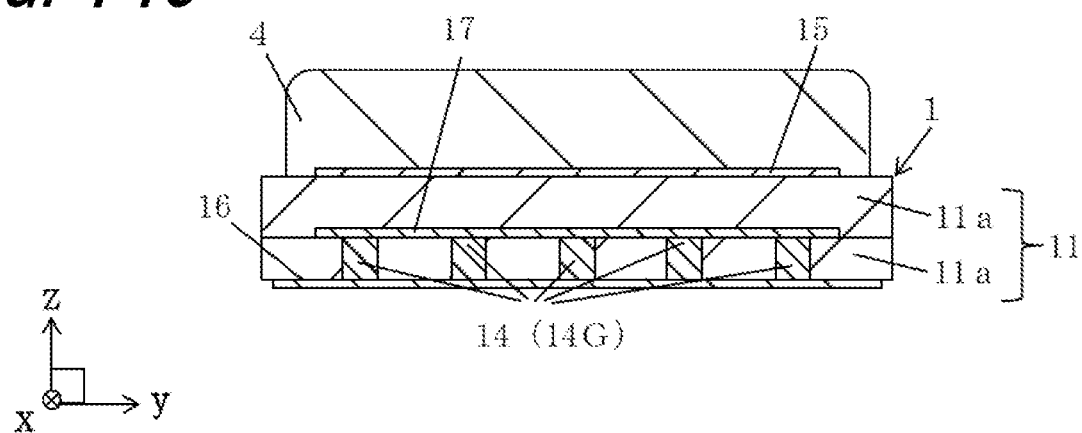

The electronic device according to the fourth embodiment of the invention is different from the electronic devices of the above embodiments in that, as an example shown in FIGS. 14A through 14C, an insulating layer 11a provided with a first via conductor group 13G and an insulating layer 11a provided with a second via conductor group 14G have different thicknesses. In the example shown in FIGS. 14A through 14C, a thickness of an insulating layer 11a provided with the second via conductor group 14G is less than a thickness of an insulating layer 11a provided with the first via conductor group 13G.

In an electronic component mounting substrate 1 according to the fourth embodiment of the invention, as in the first embodiment, a mounting portion 12 and the second via conductor group 14G are apart from each other. Accordingly, for example, while the electronic device is in operation, heat generated from the electronic component 2 and heat generated from the second via conductor group 14G are less prone to concentrate and hence deviation of heat is suppressed. Deformation and deviation of the electronic component mounting substrate 1 can be thus suppressed. Consequently, the electronic component mounting substrate 1 can have excellent reliability by making a connection between the electronic component 2 and the electronic component mounting substrate 1 or between the electronic component mounting substrate 1 and the module substrate 5 satisfactory.

Because the thickness of an insulating layer 11a provided with the second via conductor group 14G is less than the thickness of an insulating layer 11a provided with the first via conductor group 13G, a length of second via conductors 14 constituting the second via conductor group 14G becomes shorter than a length of first via conductors 13 constituting the first via conductor group 13G, and heat resistance of the second via conductors 14 constituting the second via conductor group 14G becomes smaller. Accordingly, heat generated from the second via conductor group 14G is suppressed further and hence deviation of heat is suppressed. Deformation and distortion of the electronic component mounting substrate 1 can be thus suppressed.

In the case described above, the thickness of an insulating layer 11a provided with the second via conductor group 14G is preferably set to 0.8 to 0.95 time the thickness of an insulating layer 11a provided with the first via conductor group 13G.

The electronic component mounting substrate 1 of the fourth embodiment can be suitably used in a thin, high-output electronic device and reliability of the electronic component mounting substrate 1 can be enhanced. For example, in a case where a light-emitting element is mounted as the electronic component 2, the electronic component mounting substrate 1 can be suitably used for a thin, high-luminance light-emitting device.

The electronic component mounting substrate 1 of the fourth embodiment can be manufactured by a manufacturing method the same as the manufacturing method of the electronic component mounting substrates 1 of the above embodiments.

The present disclosure is not limited to the examples in the embodiments described above and can be modified in various manners. For example, the electronic component mounting substrate 1 may have chamfered portions or arc-like notch portions formed at corners of the insulating substrate 11 in a thickness direction of the insulating substrate 11.

In the examples described above, the mounting electrodes 15 and the terminal electrodes 16 disposed, respectively, on one and the other principal faces of the insulating substrate 11 are formed by the co-firing method. However, the mounting electrodes 15 and the terminal electrodes 16 may be formed of a metal layer formed by the post-firing method or thin-film deposition known in the art. In such a case, an electronic component mounting substrate 1 and an electronic device having excellent positional accuracy can be obtained.

In the examples described above, the insulating substrate 11 is formed of two insulating layers 11a. However, the insulating layer 11 may be formed of three or more insulating layers 11a. For example, in a case where the insulating substrate 11 is formed of three insulating layers 11a, a plurality of first via conductors 13 may be formed in two insulating layers 11a close to one principal face and a plurality of second via conductors 14 may be formed in one insulating layer 11a close to the other principal face. In such a case, wiring conductors 17 which have a large region and connect a plurality of first via conductors 13 close to one principal face and a plurality of first via conductors 13 close to the other principal face may be provided between the insulating layers 11a.

The terminal electrodes 16 are disposed on the other principal face of the insulating substrate 11. However, the electronic component mounting substrate 1 may have so-called a castellation conductors in which holes are provided between a side surface and the other principal face of the insulating substrate 11 and the terminal electrodes 16 extend from the other principal face of the insulating substrate 11 to inner surfaces of the holes.

Regarding the mounting electrodes 15 and the terminal electrodes 16, the respective mounting electrodes 15 or the respective terminal electrodes 16 may differ in length or width.

Configurations of the electronic component mounting substrates 1 of the first through fourth embodiments may be combined. For example, the electronic component mounting substrate 1 of the second embodiment may include three or more terminal electrodes 16 disposed on the other principal face of the insulating substrate 11 or the electronic component mounting substrate 1 of the third embodiment may include three or more mounting terminals 15 disposed on one principal face of the insulating substrate 11.

The electronic component mounting substrate 1 of the first embodiment, the electronic component mounting substrate 1 of the third embodiment, or the electronic component mounting substrate 1 of the fourth embodiment may include the extending portions 17a of the wiring conductors 17 as in the electronic component mounting substrate 1 of the second embodiment.

The invention claimed is:

1. An electronic component mounting substrate, comprising:
   an insulating substrate having a rectangular shape in a plan view of the electronic component mounting substrate, the insulating substrate comprising a mounting portion on a principal face thereof for mounting an electronic component, the insulating substrate being formed of two or more insulating layers;
   first via conductor groups each comprising a plurality of first via conductors which are disposed side by side in a strip shape in a transparent plan view of the electronic component mounting substrate and second via conductor groups each comprising a plurality of second via conductors which are disposed side by side in a strip shape in the transparent plan view of the electronic component mounting substrate, the first via conductors and the second via conductors penetrating through the insulating substrate in a thickness direction of the insulating substrate, wherein the first and second via conductor groups are disposed in different insulating layers so as not to overlap in a transparent plan view and in a transparent side view;
   mounting electrodes located on a surface of the insulating substrate, each of the mounting electrodes connecting the plurality of first via conductors of each of the first via conductor groups,
   a number of the second via conductors being larger than that of the first via conductors,
   the mounting portion, the first via conductor groups, and the second via conductor groups being disposed so as not to overlap each other in the transparent plan view of the electronic component mounting substrate, the first via conductor groups being located between the mounting portion and the second via conductor groups, respectively, in the transparent plan view of the electronic component mounting substrate,
   a length of the second via conductor being smaller than a length of the first via conductor, and
   a thickness of the insulating layer in which the second via conductor groups are disposed, being smaller than a thickness of the insulating layer in which the first via conductor groups are disposed.

2. The electronic component mounting substrate according to claim 1, wherein each of the second via conductor groups is provided along an outer edge of the insulating substrate in the transparent plan view.

3. The electronic component mounting substrate according to claim 2, wherein one end of each of the second via conductor groups is located closer to a corner of the insulating substrate in the transparent plan view.

4. The electronic component mounting substrate according to claim 3, wherein a diameter of each of the first via conductors is larger than a diameter of each of the second via conductors.

5. The electronic component mounting substrate according to claim 2, wherein a diameter of each of the first via conductors is larger than a diameter of each of the second via conductors.

6. The electronic component mounting substrate according to claim 1, wherein the second via conductor groups are located to oppose each other in the transparent plan view.

7. The electronic component mounting substrate according to claim 6, wherein a diameter of each of the first via conductors is larger than a diameter of each of the second via conductors.

8. The electronic component mounting substrate according to claim 1, wherein the first via conductor groups are located to oppose each other in the transparent plan view.

9. The electronic component mounting substrate according to claim 8, wherein a diameter of each of the first via conductors is larger than a diameter of each of the second via conductors.

10. The electronic component mounting substrate according to claim 1, wherein a diameter of each of the first via conductors is larger than a diameter of each of the second via conductors.

11. An electronic device, comprising:
the electronic component mounting substrate according to claim 1; and
an electronic component mounted on the mounting portion.

12. An electronic module, comprising:
a module substrate comprising a connecting pad; and
the electronic device according to claim 11, the electronic device being connected to the connecting pad via solder.

13. The electronic component mounting substrate according to claim 1,
wherein the insulating substrate comprises an upper layer and a lower layer,
the via conductor groups are disposed in the upper layer, and
the second via conductor groups are disposed in the lower layer.

14. The electronic component mounting substrate according to claim 13, further comprising:
wiring conductors disposed between the upper layer and the lower layer of the insulating substrate, the wiring conductors connecting the first via conductor groups and second via conductor groups.

15. The electronic component mounting substrate according to claim 1, wherein the mounting electrodes are located on the principal face of the insulating substrate.

\* \* \* \* \*